United States Patent
Formosa et al.

(10) Patent No.: US 8,837,754 B2
(45) Date of Patent: Sep. 16, 2014

(54) MICROELECTROMECHANICAL TRANSDUCER AND CORRESPONDING ASSEMBLY PROCESS

(75) Inventors: Kevin Formosa, Zabbar Malta (MT); Mark Anthony Azzopardi, Gudja (MT); Mario Francesco Cortese, Milan (IT); Mark Shaw, Agrate Brianza (IT); Alex Gritti, Vimercate (IT); Luca Maggi, Garlate (IT); Filippo David, Milan (IT)

(73) Assignees: STMicroelectronics S.r.l., Agrate Brianza (IT); STMicroelectronics (Malta) Ltd., Kirkop (MT)

( * ) Notice: Subject to any disclaimer, the term of this patent is extended or adjusted under 35 U.S.C. 154(b) by 225 days.

(21) Appl. No.: 13/402,761

(22) Filed: Feb. 22, 2012

(65) Prior Publication Data
US 2012/0153771 A1 Jun. 21, 2012

Related U.S. Application Data

(63) Continuation-in-part of application No. PCT/EP2010/070608, filed on Dec. 22, 2010.

(30) Foreign Application Priority Data

Dec. 23, 2009 (IT) .............................. TO2009A1036

(51) Int. Cl.
| | |
|---|---|
| H04R 25/00 | (2006.01) |
| H04R 19/00 | (2006.01) |
| B81C 1/00 | (2006.01) |
| H04R 9/08 | (2006.01) |
| H04R 11/04 | (2006.01) |
| H04R 17/02 | (2006.01) |
| H04R 19/04 | (2006.01) |
| H04R 21/02 | (2006.01) |

(52) U.S. Cl.
CPC ............ *H04R 19/005* (2013.01); *B81B 2207/07* (2013.01); *B81C 2203/0792* (2013.01); *H01L 2224/48091* (2013.01); *B81C 2203/035* (2013.01); *B81B 2207/093* (2013.01); *B81B 2207/012* (2013.01); *B81C 1/0023* (2013.01); *B81C 2203/0785* (2013.01); *B81B 2201/0257* (2013.01); *H01L 2224/48137* (2013.01); *B81C 2203/019* (2013.01); *H01L 2924/10253* (2013.01)
USPC ............ 381/174; 381/175; 381/355; 381/369

(58) Field of Classification Search
USPC .......... 381/170, 174, 175, 355, 369; 257/678, 257/685, 686
See application file for complete search history.

(56) References Cited

U.S. PATENT DOCUMENTS

| | | |
|---|---|---|
| 2007/0071268 A1 | 3/2007 | Harney et al. |
| 2008/0279407 A1 | 11/2008 | Pahl |
| 2008/0283988 A1 | 11/2008 | Huang et al. |
| 2010/0183174 A1* | 7/2010 | Suvanto et al. ............... 381/174 |

OTHER PUBLICATIONS

Cheah, L.K. et al., "Gold to Gold Thermosonic Flip-Chip Bonding," Proceedings HDI 2001, pp. 165-175, Apr. 2001.

\* cited by examiner

*Primary Examiner* — Matthew Eason
(74) *Attorney, Agent, or Firm* — Seed IP Law Group PLLC

(57) ABSTRACT

A MEMS transducer has a micromechanical sensing structure and a package. The package is provided with a substrate, carrying first electrical-connection elements, and with a lid, coupled to the substrate to define an internal cavity, in which the micromechanical sensing structure is housed. The lid is formed by: a cap layer having a first surface and a second surface, set opposite to one another, the first surface defining an external face of the package and the second surface facing the substrate inside the package; and a wall structure, set between the cap layer and the substrate, and having a coupling face coupled to the substrate. At least a first electrical component is coupled to the second surface of the cap layer, inside the package, and the coupling face of the wall structure carries second electrical-connection elements, electrically connected to the first electrical component and to the first electrical-connection elements.

41 Claims, 11 Drawing Sheets

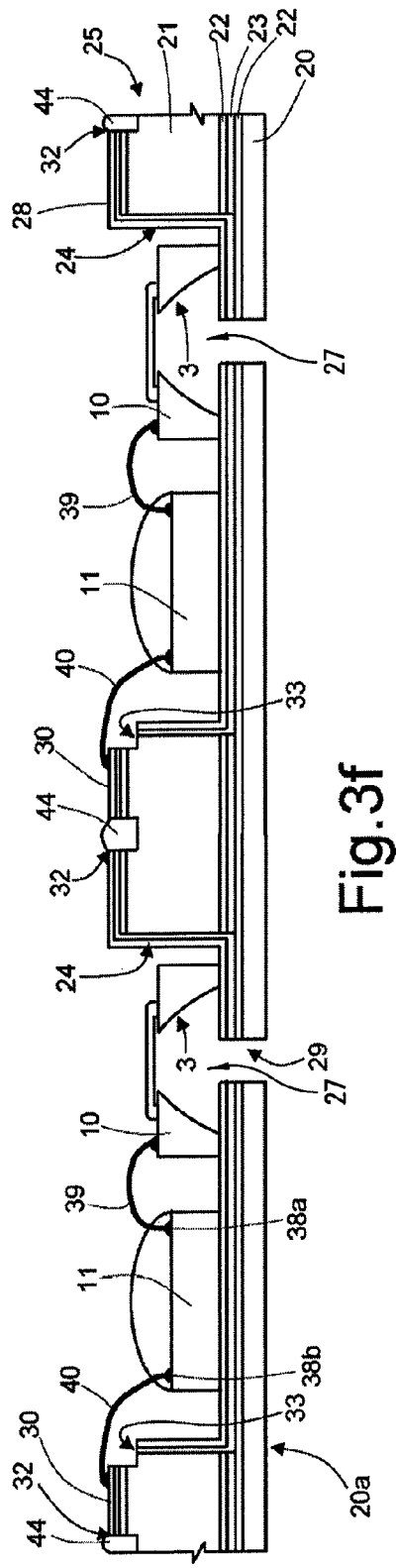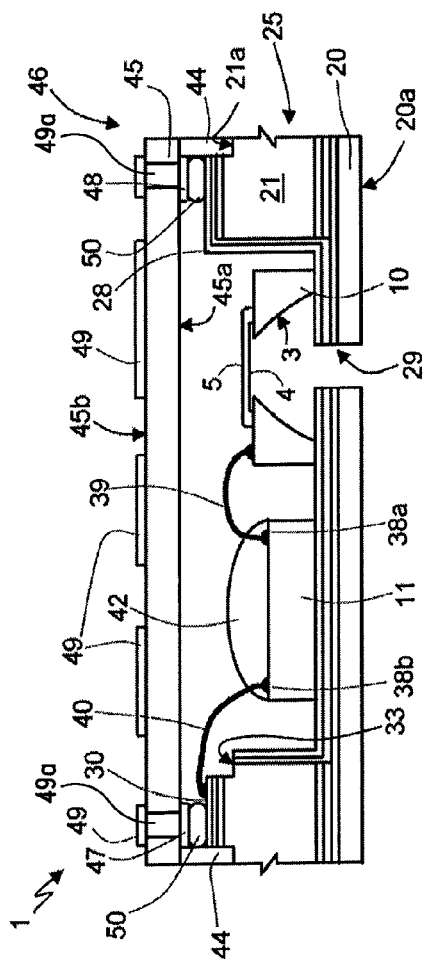

MICROELECTROMECHANICAL TRANSDUCER AND CORRESPONDING ASSEMBLY PROCESS

BACKGROUND

1. Technical Field

The present disclosure relates to a transducer of a MEMS (Micro-Electro-Mechanical System) type, in particular a capacitive microphone, to which the ensuing treatment will make explicit reference, without this implying any loss of generality, and to a corresponding assembly process.

2. Description of the Related Art

As it is usual in this technical field, the term "package" will be used herein to designate, as a whole, the casing, or covering structure, which surrounds, completely or partially, the die or dice of semiconductor material constituting the acoustic transducer, enabling electrical connection thereof to the outside (in particular, connection to a printed circuit of a corresponding electronic device).

As is known, an acoustic transducer, for example a MEMS microphone of a capacitive type, generally comprises a micromechanical sensing structure, designed to transduce acoustic pressure waves into an electrical quantity (in particular a capacitive variation), and reading electronics, designed to carry out appropriate processing operations (amongst which amplification and filtering operations) of this electrical quantity for supplying an electrical output signal (for example, a voltage).

The micromechanical sensing structure in general comprises a mobile electrode, provided as a diaphragm or membrane, set facing a fixed electrode, at a short distance of separation (gap), to provide the plates of a sensing capacitor with a capacitance that varies as a function of the acoustic pressure waves to be detected. The mobile electrode is generally anchored, by means of a perimetral portion thereof, to a fixed structure, whilst a central portion thereof is free to move, or undergo deformation, in response to the pressure exerted by the incident acoustic pressure waves, in this way causing a capacitance variation of the sensing capacitor.

In greater detail, and with reference to FIG. 1, a micromechanical sensing structure of a MEMS acoustic transducer 1, of a known type, comprises a structural layer 2 of semiconductor material, for example silicon, in which a cavity 3 is provided, for example via chemical etching from the back. A membrane, or diaphragm, 4 is coupled to the structural layer 2 and closes the cavity 3 at the top; the membrane 4 is flexible and, in use, undergoes deformation as a function of the pressure of the incident sound waves. A rigid plate 5 (generally referred to as "back-plate") is set above the membrane 4 and faces it, via the interposition of spacers 6 (for example, made of insulating material, such as silicon oxide). The back plate 5 constitutes the fixed electrode of a sensing capacitor with a variable capacitance, the mobile electrode of which is constituted by the membrane 4, and has a plurality of holes 7, designed to enable the circulation of air towards the membrane 4 (rendering the back plate 5 acoustically transparent). The micromechanical sensing structure further comprises (in a way not illustrated) membrane and back-plate electrical contacts, used for biasing the membrane 4 and the back plate 5 and detecting a signal of capacitive variation resulting from the deformation of the membrane 4 caused by the incident acoustic pressure waves; in general, these electrical contacts are arranged in a surface portion of the die, in which the micromechanical sensing structure is provided.

In a known way, the sensitivity of the MEMS acoustic transducer 1 depends on the mechanical characteristics of the membrane 4 of the micromechanical sensing structure (in particular upon its so-called "mechanical compliance") and on the type of assembly of the membrane 4 and back plate 5.

In addition, the volume of the front acoustic chamber or simply "front chamber" (i.e., the space traversed in use by acoustic pressure waves coming from the external environment through an appropriate access port), and the volume of the back acoustic chamber, or "back-chamber" (i.e., the space that is located on the opposite side of the front chamber with respect to the membrane 4, set in use at a reference pressure) directly affect the acoustic performance of the transducer.

In particular, the volume of the front chamber behaves as a sort of Helmholtz resonator, on account of the oscillations of the air penetrating through the access port. In fact, the acoustic input signal causes an increase in the pressure of the air inside the front chamber, which consequently acts as a spring pushing out air from the same chamber. As a result of the forces of inertia of the air mass leaving the front chamber, the increase of pressure inside the same chamber is over-compensated, causing a pressure drop, and the negative pressure that is created in the front chamber attracts new air therein. This repeated change of pressure generates the oscillations of air inside the front chamber, at a given resonance frequency. The volume of the front chamber is such as to determine the upper resonance frequency of the acoustic transducer, and hence its performance for high frequencies (in fact, the operative frequency band of the acoustic transducer has to be lower than the resonance frequency of the oscillations of the air): in general, the smaller the volume of the front chamber, the higher the upper cut-off frequency of the transducer in so far as the resonance frequency of the oscillations of air shifts towards higher frequencies.

The back chamber behaves, instead, as a closed volume subject to compression, with the consequence that the smaller the volume of the back chamber, the lower the sensitivity of the acoustic transducer (in fact, it is as if the deformations of the membrane were hindered by the action of a high-stiffness spring). It is hence generally desirable to provide a back chamber of large dimensions so as to improve the sensitivity of the acoustic transducer.

The volume of the front chamber and/or of the back chamber of the MEMS acoustic transducer not only depend upon the configuration of the micromechanical sensing structure, but also upon the conformation of the corresponding package, which has to be configured so as to house not only the same micromechanical sensing structure, but also the reading electronics associated thereto, generally provided as an ASIC in a respective die of semiconductor material.

In the design stage, it has also to be considered that the presence of acoustic access ports, directly communicating with the external environment, designed to enable entry of the acoustic pressure waves towards the membrane 4 of the micromechanical sensing structure, involves the further requirement of pre-arranging appropriate shields for the incident light, which could jeopardize proper operation of the micromechanical sensing structure and of the reading electronics.

Several constraints are thus imposed on the assembly of a MEMS acoustic transducer (and of the corresponding package), which render design thereof particularly problematical, especially where compact dimensions and high electrical and mechanical performance are called for.

In a known assembly arrangement, represented schematically in FIG. 2, a first die 10, integrating the micromechanical sensing structure (here only shown schematically), and a second die 11, integrating the ASIC of the corresponding reading electronics, are coupled side-by-side on a substrate 12. Electrical connections 15 between the first and second dice 10, 11, and between the first die 10 and the substrate 12, are provided with the wire-bonding technique (i.e., with appropriate electrical wires), whilst metallization layers and vias (not shown in detail) are provided through the substrate 12 for routing the electrical signals towards the outside of the package of the MEMS acoustic transducer, which is once again designated as a whole by 1. In a way not illustrated, pads (in the case of an LGA—Land-Grid Array—package), or conductive spherical elements (in the case of a BGA—Ball-Grid Array—package), or similar connection elements, are moreover provided on the underside of the substrate 12 for soldering and electrical connection to an external printed circuit of a corresponding electronic device.

A cap 16 is coupled to the substrate 12, and encloses within it the first and second dice 10, 11. The cap 16 may be made of metal, or of a pre-molded plastic coated within with a metallization layer, in such a way as to prevent disturbance due to external electromagnetic signals (by providing a sort of Faraday cage). The cap 16 is generally attached to the substrate 12 by means of a conductive glue 17 (for example, epoxy resin) so as to obtain also a ground connection towards the substrate 12. The cap 16 further has an opening 18 to enable entry into the package of acoustic pressure waves coming from the external environment.

The above solution is not however free from drawbacks. In particular, the cap 16 is made through molding and hence requires, during production, a set of specific and dedicated molding tools (comprising, for example, dies and punches), for each possible variation of dimensions and shapes that may prove necessary in time, for example following upon the evolution of the dimensions of the silicon structures or upon specific requirements of the end user. In addition, the pitch and layout of the molding and punching tools are not always compatible with the dimensions and configuration of the array of contacts (for example, of an MAP-BGA—Mold-Array Process—Ball-Grid Array—type) each time used for MEMS devices. The production and fixing of the cap 16 to the substrate 12 cannot hence be obtained with technologies and equipment for so-called "mass production".

The above solution involves large dimensions for accommodating side-by-side the two dice of the MEMS acoustic transducer and for providing the corresponding package, and in general has the disadvantage of not offering to the designer a sufficient freedom (as instead would be desirable) in the sizing of the front and back chambers of the acoustic transducer, for determination of its electrical characteristics. Moreover, in general, providing the electrical connections 15, in particular towards the substrate of the package, can prove problematical in the flow of the assembly process.

BRIEF SUMMARY

The present disclosure is directed to an appropriate assembly of a MEMS acoustic transducer and of a corresponding package, which will enable solution of the problems highlighted above, and in particular enable reduced manufacturing costs, high acoustic performance and reliability, and small dimensions.

One embodiment of the present disclosure is directed to a MEMS transducer that includes a package having an internal cavity, a substrate having a first surface and a second surface, a plurality of first electrical-connection elements coupled to the first surface of the substrate, and a lid coupled to the substrate. The lid includes a cap layer having a first surface and a second surface and a wall structure having a coupling surface, the wall structure positioned between the second surface of the cap layer and the first surface of the substrate to form the internal cavity. The package also includes a plurality of second electrical-connection elements coupled to the coupling surface of the wall structure and coupled to the plurality of first electrical-connection elements on the substrate. The transducer includes a micromechanical sensing structure coupled to the second surface of the cap layer and a first electrical component coupled to the second surface of the cap layer and coupled to the second electrical-connection elements.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings. In the drawings, identical reference numbers identify similar elements or acts. The size and relative positions of elements in the drawings are not necessarily drawn to scale.

FIGS. 3a-3g show cross sections through a MEMS acoustic transducer, in successive steps of the corresponding assembly process, according to one embodiment of the present disclosure;

DETAILED DESCRIPTION

As will be discussed in detail in what follows, one aspect of the present disclosure envisages providing a specific cap structure for the package of a MEMS acoustic transducer, of a composite type, constituted by the assembly of two layers made of a same plastic material, obtained with standard semiconductor techniques (such as standard techniques for obtaining BGA, LGA substrates, or the like). In addition, one or both of the dice of the MEMS acoustic transducer (integrating the micromechanical sensing structure and, respectively, the corresponding ASIC), and/or further electrical/electronic components, are directly coupled to the cap structure, instead of being coupled to a substrate to which the same cap structure is bonded for providing the package of the MEMS acoustic transducer and its connection to an external printed circuit board.

Figure 3A:
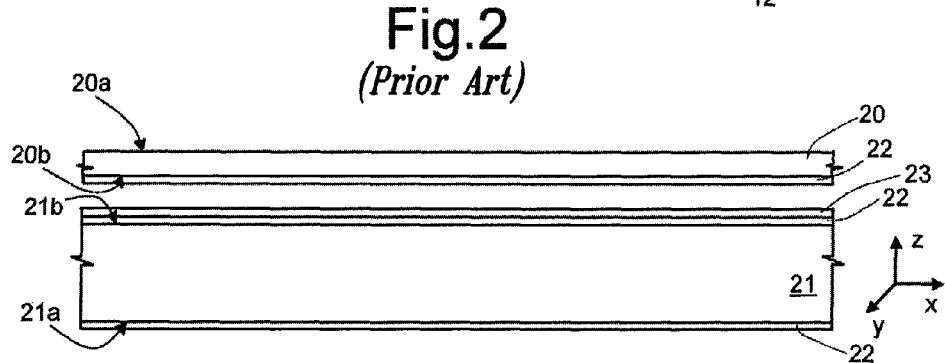

In detail, and with reference firstly to FIG. 3a, a process of assembly of a MEMS acoustic transducer initially envisages providing a first cap layer 20 and a second cap layer 21, made of one and the same plastic material, in particular a core of an epoxy resin, and specifically a laminated BT (bismaleimide triazine).

The first cap layer 20 has a first main face 20a and a second main face 20b (where by "main faces" is meant the surfaces of greater extension of the layer, in a horizontal plane xy), and a first thickness along a vertical axis z, transverse to the horizontal plane xy. In particular, the first main face 20a, as will be clarified hereinafter, is designed to define the upper face of the package of the MEMS acoustic transducer (in the so-called "top port" configuration, i.e., with a corresponding acoustic access port facing in the opposite direction with respect to the printed circuit board to which the MEMS acoustic transducer is designed to be coupled). The second cap layer 21 has, in turn, a respective first main face 21a and a respective second main face 21b, and a second thickness, greater than the first thickness of the first cap layer 20. In particular, the second thickness is a function, for reasons that will be clarified hereinafter, of the vertical dimensions of the dice of the MEMS acoustic transducer (integrating, as previously underlined, the micromechanical sensing structure and the corresponding ASIC).

The main faces of the first cap layer 20 and of the second cap layer 21 are coated, with techniques of a standard type, by a thin first metal layer 22 (as shown in FIG. 3a, the first main face 20a of the first cap layer 20, designed to define the outer surface of the package, may not be metallized). In addition, an adhesion layer 23, of non-conductive adhesive material, is formed on the first metal layer 22 in a region corresponding to the second main face 21b of the second cap layer 21.

Then (see FIG. 3b), a cavity 24 is provided through the second cap layer 21, traversing it throughout its thickness and moreover traversing the first metal layer 22 (in regions corresponding to both of its main faces 21a, 21b) and the adhesive layer 23. In a way here not illustrated, the cavity 24 has, for example, a rectangular shape in plan view (in the horizontal plane xy) and, for the reasons that will be clarified hereinafter, dimensions such as to accommodate within it one or both of the dice of the micromechanical sensing structure and of the ASIC of the MEMS acoustic transducer.

Figure 3B:
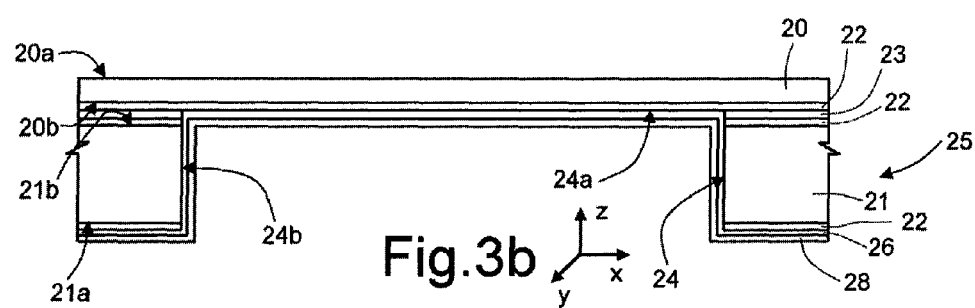

Note that FIG. 3b, as likewise the subsequent ones (unless otherwise indicated), show only a portion of the aforesaid cap layers 20, 21, for providing a single MEMS device, it being, however, evident that a plurality of MEMS devices, set side-by-side, are provided by means of the same processing steps (so that, for example, several cavities 24 are made through the second cap layer 21 in this step, set at a distance apart from one another by an appropriate pitch, according to the final dimensions that the individual MEMS devices are to assume after the final cutting or "singulation" operation).

Next, the first and second cap layers 20, 21 are joined together, in a stacked way (the so-called "stacking operation"), via the interposition, between the corresponding surfaces in contact (in areas corresponding to the respective second main faces 20b, 21b), of the adhesive layer 23 (the so-called "bonding operation"), forming in this way a composite cap 25. The first cap layer 20, and in particular the corresponding second main face 20b (with the first metal layer 22 superimposed thereon), constitutes a top delimitation surface 24a of the cavity 24, closing it at the top (considering that, as pointed out previously, the first cap layer 20a is designed to constitute the upper face of the package of the MEMS acoustic transducer, in a "top port" configuration).

Next, a seed layer 26 is grown, constituted by a thin metal film, on the top delimitation surface 24a of the cavity 24, on the side walls, designated by 24b, of the same cavity 24 and moreover on the first metal layer 22 in a region corresponding to the first main face 21a of the first cap layer 21. Then, formed on the seed layer 26, for example using the electroplating technique or the sputtering technique, is a second metal layer 28, which coats, in particular, the inside of the cavity 24.

Figure 3C:
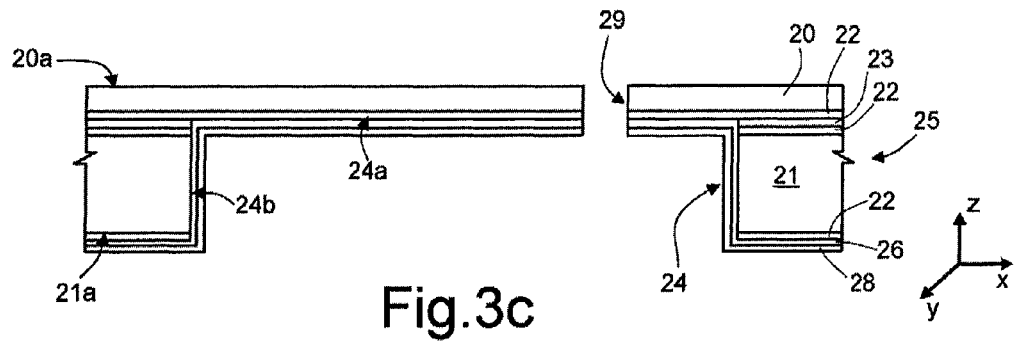

Next (as shown in FIG. 3c), an acoustic access port 29 is provided, using micromachining techniques of a standard type, through the entire thickness of the first cap layer 20 and through the first metal layer 22, the seed layer 26 and the second metal layer 28. The acoustic access port 29 is, for example, constituted by a through hole with circular cross section extending from the first main face 20a of the first cap layer 20 as far as the cavity 24. As will be clarified hereinafter, the acoustic access port 29 is designed to enable entry of acoustic pressure waves into the package of the MEMS acoustic transducer.

In this step, in a way not illustrated, marking of the package can advantageously be carried out, for example for providing information regarding the manufacturing lot; in particular, marking can be carried out on the first main face 20a of the first cap layer 20, which is in fact accessible for the marking tools.

Figure 3D:
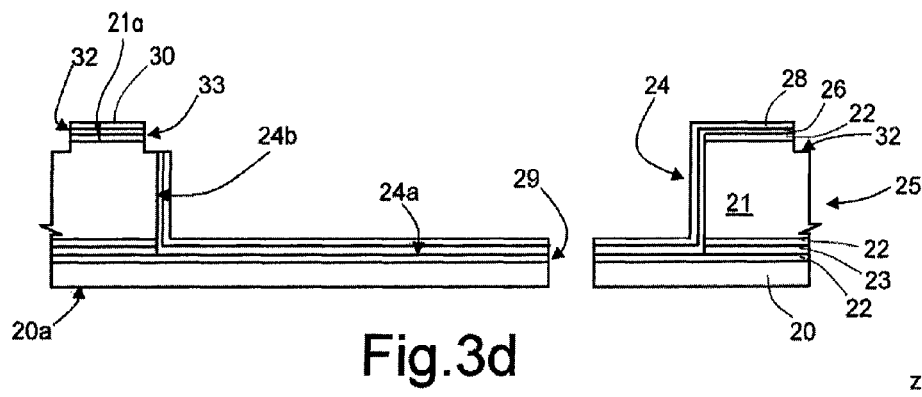

According to one aspect of the present disclosure (see FIG. 3d, as well as the corresponding perspective view of FIG. 4), the composite cap 25 is turned upside down along a vertical direction, and, via standard cutting processes (the so-called "sawing" operation), for example using a diamond-saw cutting tool, the second metal layer 28 is appropriately processed, for providing, at the first surface 21a of the second cap layer 21, a plurality of cavity contact pads or lands, denoted with 30 and referred to as "CCLs" (cavity-connect lands), electrically insulated from one another. As will be clarified hereinafter, the cavity-connect lands 30 are designed to be contacted electrically, in particular using the wire-bonding technique, by electrical components that will subsequently be coupled to the composite cap 25, in an area corresponding to the top delimitation surface 24a of the cavity 24.

Figure 4:
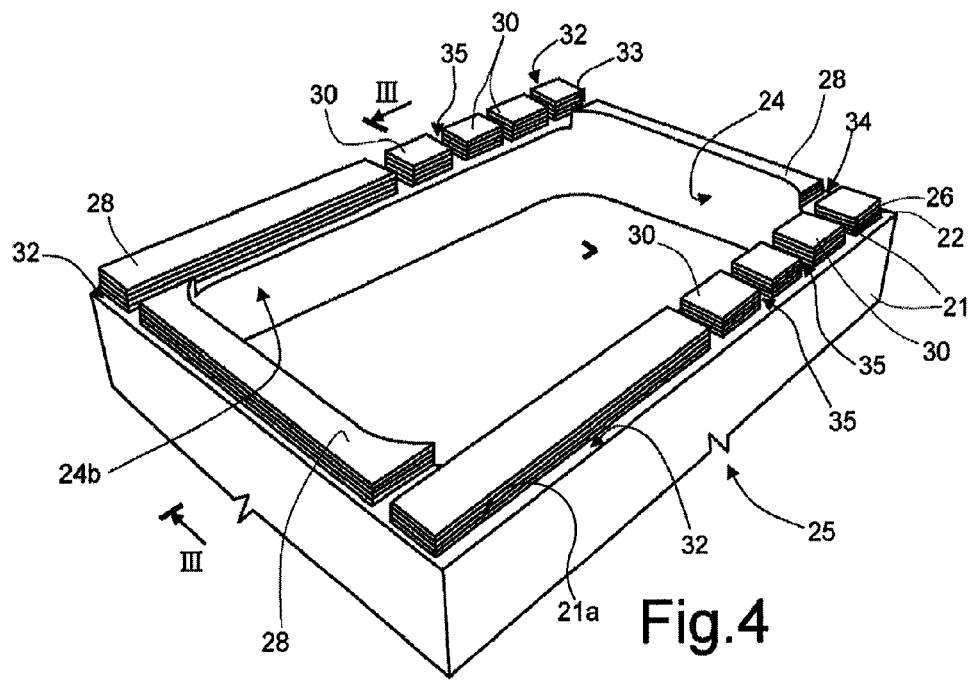
FIG. 4 is a perspective schematic view of the transducer of FIG. 3d, which moreover shows the (broken) line of cross section along which the representation of FIG. 3d is obtained.

In greater detail, during the aforesaid cutting operation, the following elements are defined by way of removal of material: an outer groove 32, a first inner groove 33, and a second inner groove 34 (see FIG. 4). The outer groove 32 has a perimeter substantially rectangular in the horizontal plane xy, which surrounds the cavity 24 at a given distance, and a depth such as to remove the second metal layer 28, the seed layer 26, and the first metal layer 22. The first and second inner grooves extend inside the outer groove 32, at the side walls 24b of the cavity 24, and have substantially the same depth as the same outer groove 32. In particular, the first and second inner grooves 33, 34 extend parallel to one another along respective major sides of the cavity 24 (in the example shown in FIG. 4, along the axis y), extending in part through a surface portion of the second cap layer 21, at the edge between the first main face 21a of the second cap layer 21 and the side walls 24b of the cavity 24. Consequently, two parallel strips of metal material are defined between the outer groove 32 and the first and second inner grooves 33, 34, the strips being electrically insulated from the coating layer inside the cavity 24, on account of the presence of the same first and second inner grooves 33, 34.

During the sawing operation, a plurality of recesses 35 (visible in FIG. 4) are moreover cut, having for example the same depth as the grooves 32, 33, 34, and extending in a direction transverse to, and starting from, the outer groove 32, as far as the first inner groove 33 or, respectively, the second inner groove 34 (hence traversing entirely the aforesaid parallel strips of metal material). In particular, the recesses 35 thus define, between them, the cavity-connect lands 30, which are electrically insulated from one another and moreover insulated with respect to remaining portions, denoted with 28', of the second metal layer 28 (which remain at the side walls 24b of the cavity 24 and at the first main face 21a of the second cap layer 21, around the same cavity 24). The remaining portions 28' may advantageously electrically connected to a ground reference potential, so as to define an electromagnetic shield for the MEMS device.

For example, as may be seen in FIG. 4, three cavity-connect lands 30 may be provided, in a region corresponding to an end portion of each major side of the cavity 24. In any case, it is emphasized that the depth of cut, the shape, number, and positioning of the various cavity-connect lands 30 can vary with respect to what is illustrated, for example in such a way as to be optimized with respect to the electrical connection requirements and characteristics of the MEMS acoustic transducer.

Figure 1:
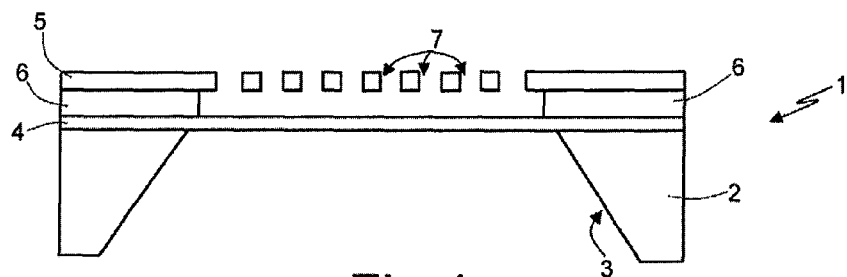
FIG. 1 is a schematic cross section of a micromechanical sensing structure of a MEMS acoustic transducer, of a known type.
Figure 2:
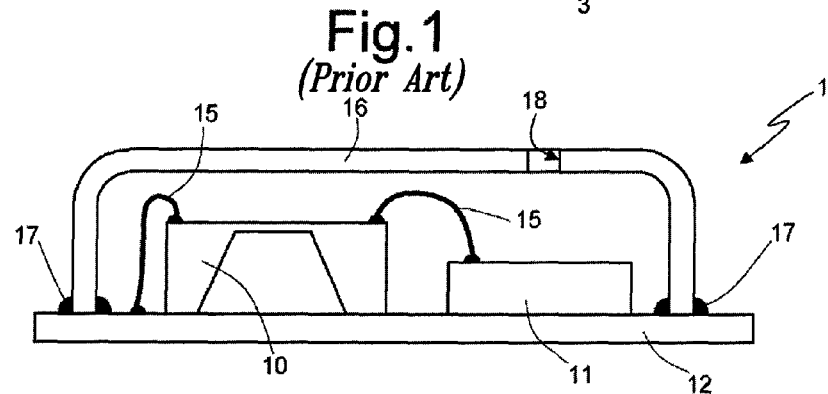
FIG. 2 is a schematic cross section of a MEMS acoustic transducer and of the corresponding package, of a known type.
Figure 5:
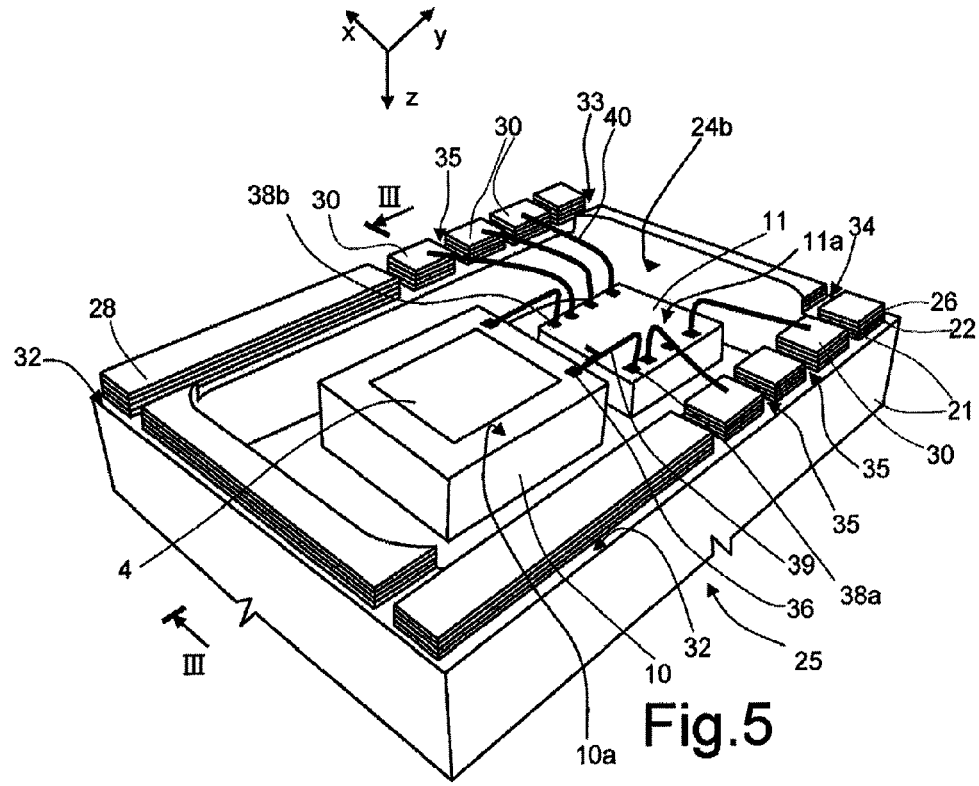
FIG. 5 is a perspective view of the transducer of FIG. 3e, which again shows the (broken) line of cross section along which the representation of FIG. 3e is obtained.

After the sawing operation (see FIG. 3e and the corresponding FIG. 5), a first die, designated once again by 10, which integrates the micromechanical sensing structure (shown schematically, and provided, by way of non-limiting example, as described previously with reference to FIG. 1), and a second die, designated once again by 11, integrating an ASIC of the corresponding reading electronics, are coupled to the composite cap 25 at the top delimitation surface 24a of the cavity 24. In particular, a bottom surface 10a, 11a of both of the dice 10, 11 is glued by means of adhesive material to the second metal layer 28 in an area corresponding to the top delimitation surface 24a of the cavity 24. First contact pads 36 associated to the membrane 4 and to the back plate 5 (here illustrated schematically) of the micromechanical sensing structure integrated in the first die 10, carried by a top surface 10b thereof, and moreover second and third contact pads 38a, 38b, electrically connected to the circuit components of the ASIC integrated in the second die 11, carried by a respective top surface 11b thereof, instead face the horizontal plane (parallel to the plane xy) defined by the first main face 21a of the second cap layer 21.

In addition, the first die 10 is positioned with respect to the composite cap 25 in such a way that the cavity 3 of the corresponding micromechanical sensing structure faces and is in fluid communication with the acoustic access port 29 so that the cavity 3 constitutes the front chamber 27 of the MEMS acoustic transducer.

The electrical connections to/from the first and second dice 10, 11 are then provided using the wire-bonding technique, by connecting: first electrical wires 39 between the first contact pads 36 and the second contact pads 38a (in such a way as to convey the electrical quantities detected by the micromechanical sensing structure towards the ASIC); and, according to one aspect of the present disclosure, second electrical wires 40 between the third contact pads 38b and respective cavity-connect lands 30 (in such a way as to enable, as will be described hereinafter, carrying the electrical signals generated by the ASIC to the outside of the package or else to further electrical/electronic components present inside the same package).

Figure 3E:
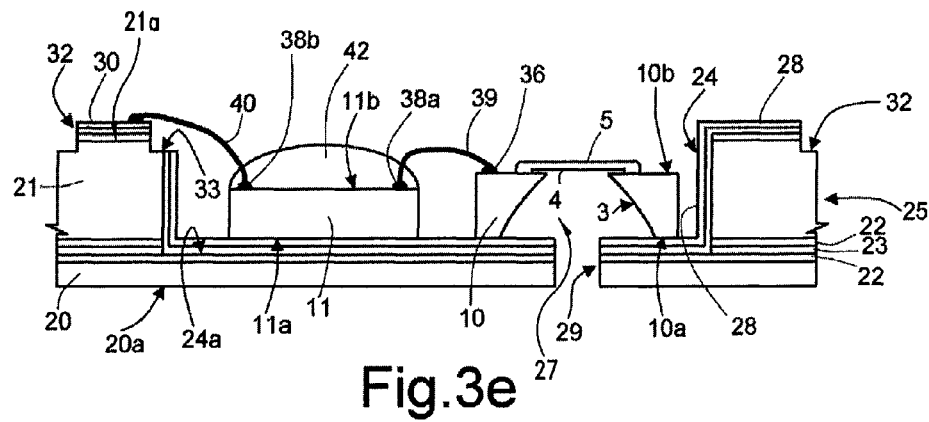

As shown schematically only in FIG. 3e, a coating region 42 (the so-called "glob top" region), made of appropriate material, can be formed, optionally, on the top surface 11b of the second die 11 in such a way as to shield the ASIC from light radiation at spurious wavelengths, which are not blocked by the material of the composite cap 25 and by the material (typically silicon) of which the membrane 4 and the back plate 5 of the micromechanical sensing structure are made. In this regard, it should in fact be noted that in the package structure proposed, the membrane 4 and the back plate 5 act as an interface between the outside of the package (in particular, the environment external to the acoustic access port 29) and the cavity 24 inside the same package. Alternatively, on the top surface 11b of the second die 11a thin film of an appropriate protective material can be formed, which performs the same function of shielding the light radiation.

Next (see FIG. 3f where, by way of example, portions of two MEMS devices set side-by-side, obtained starting from the same layers, are shown), a sealing material (for example, a non-conductive resin) is distributed along what will be, after the final singulation operation, the perimeter of each MEMS device, and in particular inside the outer groove 32, thus creating therein a sealing region 44; sealing material may also distribute within inner groove 34 and recesses 35. In particular, the sealing region 44 also constitutes an attachment base for coupling to a PCB (printed-circuit board) of a standard type.

Figure 6A:
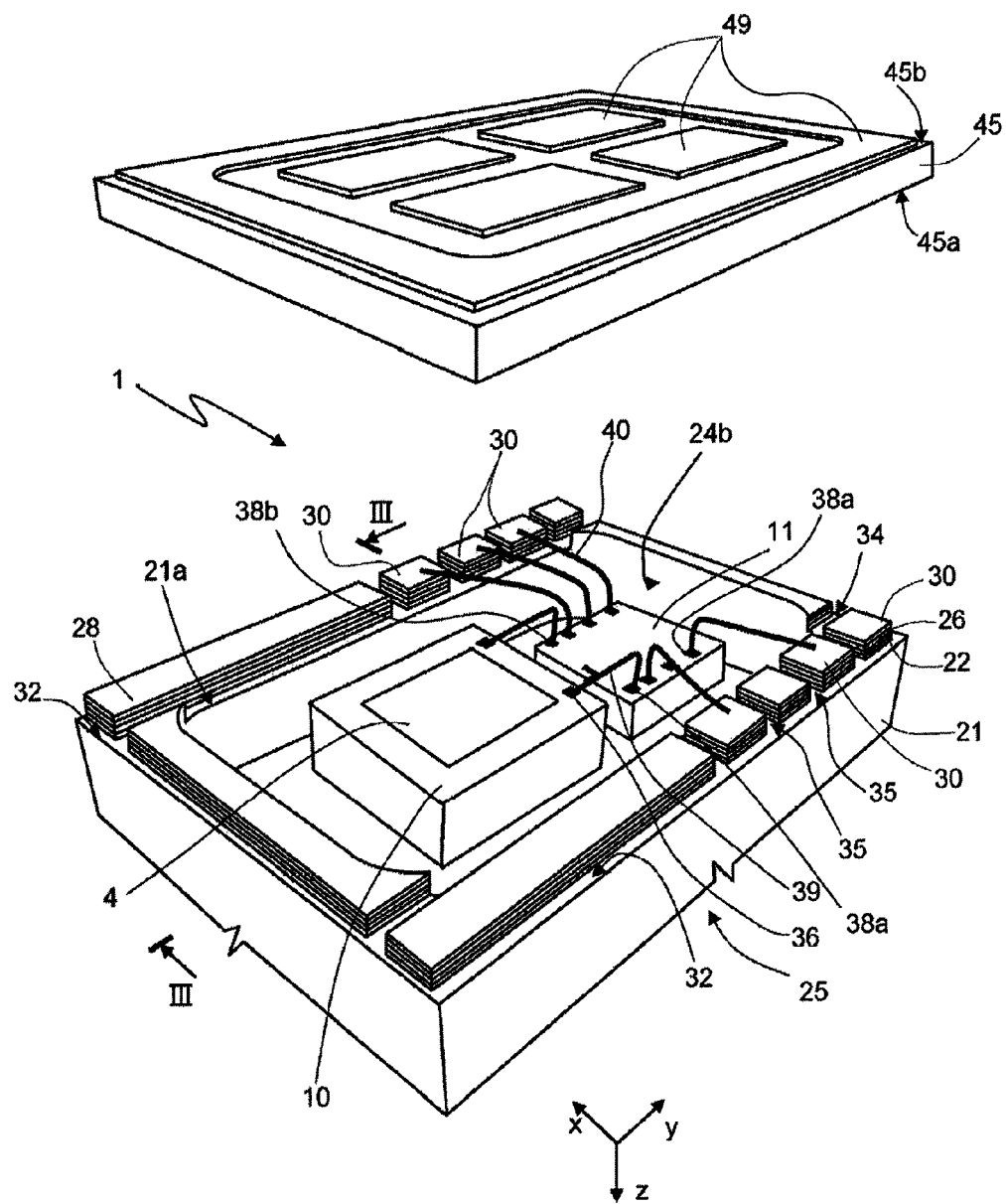
FIGS. 6a, 6b are schematic perspective views, respectively, from above and from beneath, partially in cutaway view, of the MEMS acoustic transducer of FIG. 3g.
Figure 6B:
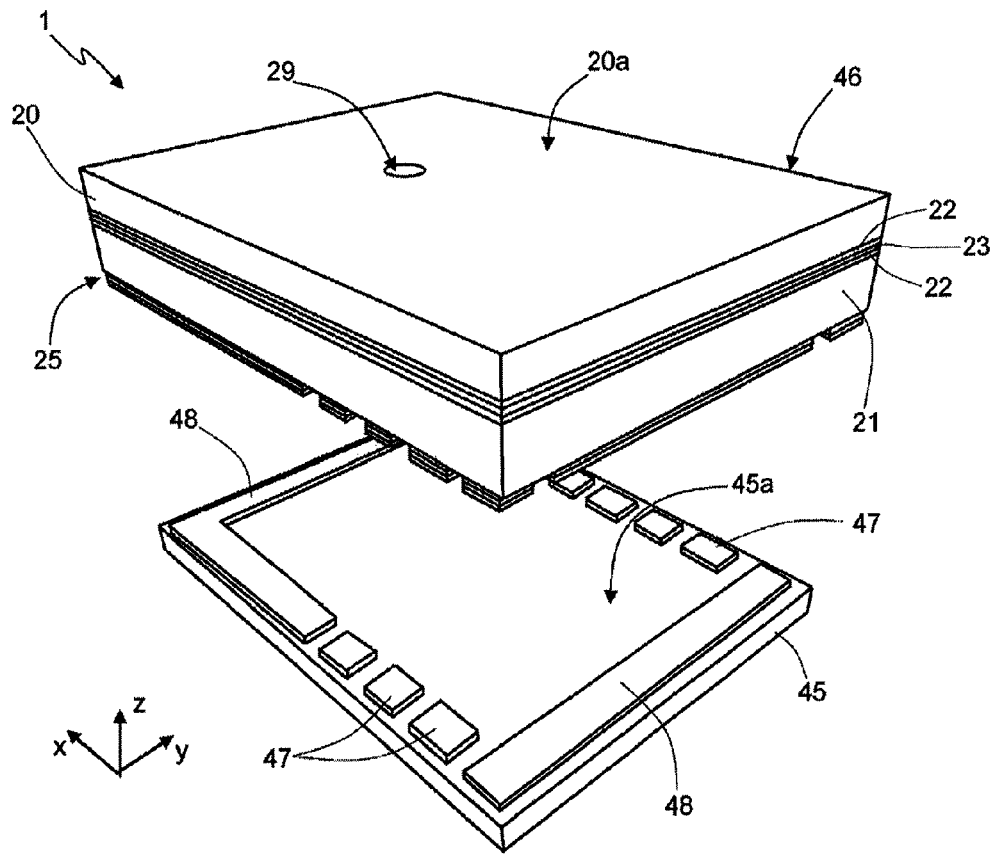

In this regard (see FIG. 3g and the corresponding FIGS. 6a and 6b), the assembly process proceeds with coupling of a printed-circuit substrate 45 to the composite cap 25 in an area corresponding to the first main face 21a of the second cap layer 21 so as to close at the bottom (with respect to vertical axis z) the cavity 24 that is to constitute the back chamber of the MEMS acoustic transducer, here designated once again by 1. The printed-circuit substrate 45 has a first main face 45a set facing the inside of the cavity 24, and a second main face 45b set facing the outside of the package of the MEMS acoustic transducer 1, here designated as a whole by 46.

Provided on the first main face 45a (see in particular FIG. 6b) are: substrate contact pads 47, made of metal material, for example in a number and with an arrangement corresponding to those of the cavity-connect lands 30; and conductive strips 48, having shapes and an arrangement such as to superimpose (as is evident from FIGS. 6a and 6b) on the aforesaid remaining portions 28' of the second metal layer 28 in an area corresponding to the first main face 21a of the second cap layer 21, providing an electrical contact with the same portions. In a way not illustrated, on the aforesaid first main face 45a and/or inside the same printed-circuit substrate 45, connection paths, metallized vias, and/or further electrical-connection elements are moreover provided.

Instead, elements for electrical connection towards the outside are provided on the second main face 45b of the printed-circuit substrate 45, in particular for connection to a printed circuit board (or other support), to which the MEMS acoustic transducer is to be coupled. In the case illustrated, these electrical-connection elements are constituted by external contact pads 49 (connection with the LGA technique), which are appropriately connected (for example, by the metallized vias 49A traversing the printed-circuit substrate 45) to the substrate contact pads 47 and/or the conductive strips 48.

In greater detail, and as illustrated in FIG. 3g, contact regions 50, e.g. bumps of a solder-paste, are pre-applied in appropriate areas on the first main face 45a of the printed-circuit substrate 45, for example in areas corresponding to the substrate contact pads 47 and/or the conductive strips 48. The contact regions 50 can be applied using the screen-printing technique, or pre-applied during production of the printed-circuit substrate 45. Then, the printed-circuit substrate 45 is positioned, using the flip-chip technique, with the first main face 45a facing the first main face 21a of the second cap layer 21 (in particular exploiting the resting base offered by the sealant region 44) in such a way that the substrate contact pads 47 are positioned at the cavity-connect lands 30. At this point, the stacked assembly of the printed-circuit substrate 45 and the composite cap 25 is subjected to brazing (the so-called "reflow" operation), in such a way as to obtain their mechanical and electrical bonding, by soldering. Like this, the package 46 is formed and the back chamber of the MEMS acoustic transducer 1 (constituted by the cavity 24 internal to the package 46) is defined, which is thus sealed from the external environment and also shielded from electromagnetic disturbance. It may be noted that the ASIC in the second die 11 of the MEMS acoustic transducer 1 is, at the end of the aforesaid stacked assembly, automatically connected by means of the electrical connections described to the substrate contact pads 47, and, consequently, to the external contact pads 49 for connection towards the outside of the package 46. In particular, once assembly is completed, the contact regions 50 are located beside the sealing region 44, within the package 46. The same contact regions 50 thus define both electrical contacts between the cavity-connect lands 30 and the substrate contact pads 47, and closure of the electromagnetic shield for the MEMS transducer, connecting the remaining portions 28' of the second metal layer 28 and the conductive strips 48 to the ground reference potential.

According to an advantageous embodiment, both the sealing region 44 and the electrical contact regions 50 may be made of a same material, in particular a special resin, like the Anisotropic Conductive Paste (ACP) by ThreeBond Co., Ltd., which, after a single press process, may provide conductivity between the pads along the vertical axis z and also non-conductivity in the horizontal plane xy, so as to electrically insulate the same pads along the x and y axes.

Finally, using traditional cutting techniques, the various MEMS acoustic transducers 1 (and the corresponding packages 46) are singulated. The finished devices are then subjected to the usual testing procedures (for the so-called "sorting" operation). In the final structure of the package 46, the shielding effect provided by the composite cap 25 in regard to the cavity 24 is enhanced as compared to traditional structures, thanks to the fact that two layers of the same material (first and second cap layers 20, 21) are coupled together and to the fact that the inside of the same cavity 24 is uniformly coated with one and the same layer of conductive material (the second metal layer 28). In addition, the use of the sealing region 44, of non-conductive material, for coupling between the composite cap 25 and the printed-circuit substrate 45 enables improved hermetic sealing.

In particular, it may be noted that the definition of the cavity-connect lands 30 when providing the composite cap 25, using traditional cutting techniques, advantageously enables different conductive patterns and electrical-connection pads to be obtained on the portions of the first main face 21a of the second cap layer 21 adjacent to the cavity 24, for connection to the printed-circuit substrate 45 during assembly of the package 46. This solution at the same time enables the following results to be obtained in a simplified manner: electrical connections, inside the package, between the first and second dice 10, 11 of the MEMS acoustic transducer, which are housed in the cavity 24 and are directly coupled to the composite cap 25, and the printed-circuit substrate 45 that is to be connected to external printed circuit boards; and a composite cap 25 having a totally shielded cavity 24 in such a way as to guarantee proper shielding against electromagnetic disturbance.

In addition, it is to be noted that, advantageously, the front chamber 27 of the MEMS acoustic transducer is in this case constituted by just the cavity 3 of the corresponding micromechanical sensing structure, and can consequently be controlled via an appropriate design of the micromechanical same sensing structure; in particular, it is easy to obtain reduced volumes of the front chamber. This solution also renders the assembly process more robust given that the volume of the front chamber does not depend upon the realization and proper positioning of the components within the cavity 24.

Instead, once again advantageously, the volume of the back chamber is represented by the entire cavity 24, internal to the package 46, so that the upper limit for this volume is represented only by the external dimensions of the package 46, which can easily be defined at the design stage. In particular, given that the characteristics of the back chamber are linked principally to the structure of the package 46, it is possible to obtain micromechanical sensing structures of small dimensions (for example, using thinner silicon wafers as starting structural layers).

Figure 7:
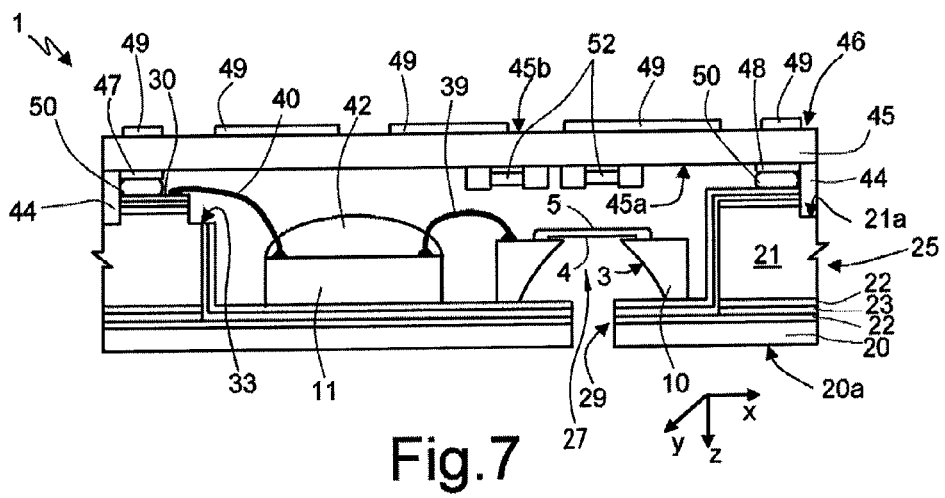
FIG. 7 is a cross-sectional view similar to that of FIG. 3g, regarding a different embodiment of the present disclosure.

A different embodiment of the present disclosure (shown in FIG. 7) envisages the possibility that further electrical components 52, for example SMDs (surface-mounted devices), are coupled, in a known way, to the first main face 45a of the printed-circuit substrate 45. For example, the electrical components 52 can be resistors, capacitors, or other active or passive components. Moreover, in this way, also further packages of electronic devices, such as full-molded or pre-molded packages can be arranged inside the cavity 24 (by means of coupling to the first main face 45a of the printed-circuit substrate 45).

Generally, the possibility of exploiting the first main face 45a of the printed-circuit substrate 45 (to which in this case the dice of the MEMS acoustic transducer are not coupled) for connection of further electrical/electronic components advantageously enables maximization of the space occupied inside the cavity 24, in this way reducing the occupation of area on the external printed circuit board to which the package 46 of the MEMS acoustic transducer 1 is coupled. Furthermore, this solution guarantees that all the electrical components 52 inside the package 46 are adequately shielded from EMI disturbance, since they are arranged inside the cavity 24, which is in turn totally shielded. It is to be noted that in the embodiment illustrated, the electrical components 52 are, at least in part, vertically set on top of the first die 10 inside the package 46. The electrical components 52 can be electrically connected to the ASIC integrated in the second die 11, through the cavity-connect lands 30, the second electrical wires 40, the contact regions 50, the substrate contact pads 47, and appropriate electrical paths (or similar electrical connections) integrated in the printed-circuit substrate 45. Alternatively, or in addition, the electrical components 52 are connected to the outside of the package through the external contact pads 49 and, again, electrical paths (or other electrical connections) in the printed-circuit substrate 45.

Figure 8:
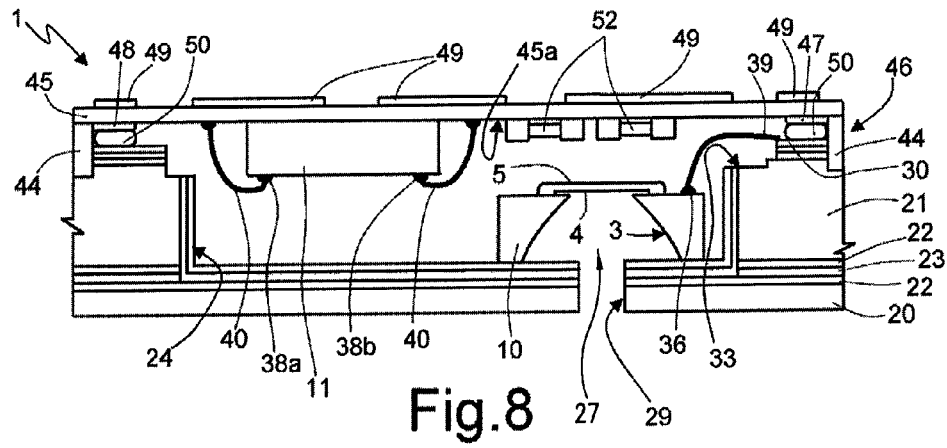
FIG. 8 is a cross-sectional view similar to that of FIG. 3g, regarding yet another different embodiment of the present disclosure.
Figure 9A:
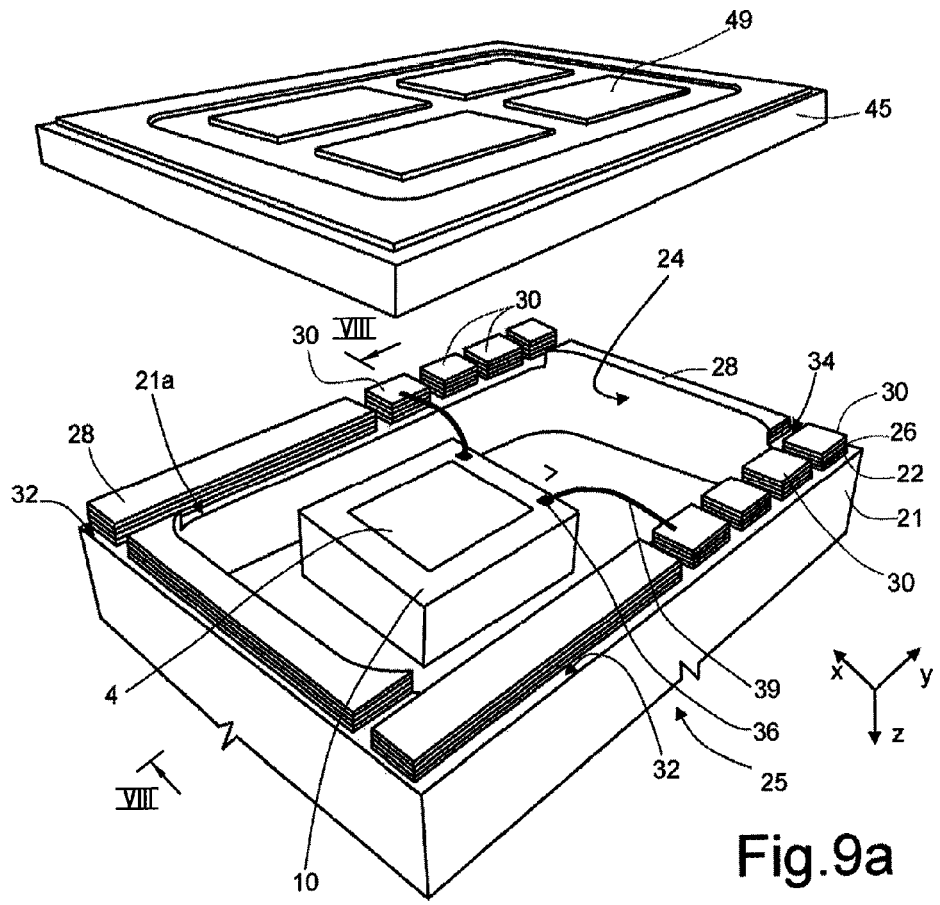
FIGS. 9a, 9b are schematic perspective views, respectively, from above and from beneath, of the MEMS acoustic transducer of FIG. 8 (FIG. 9a shows the broken line of cross section along which the representation of FIG. 8 is obtained)
Figure 9B:
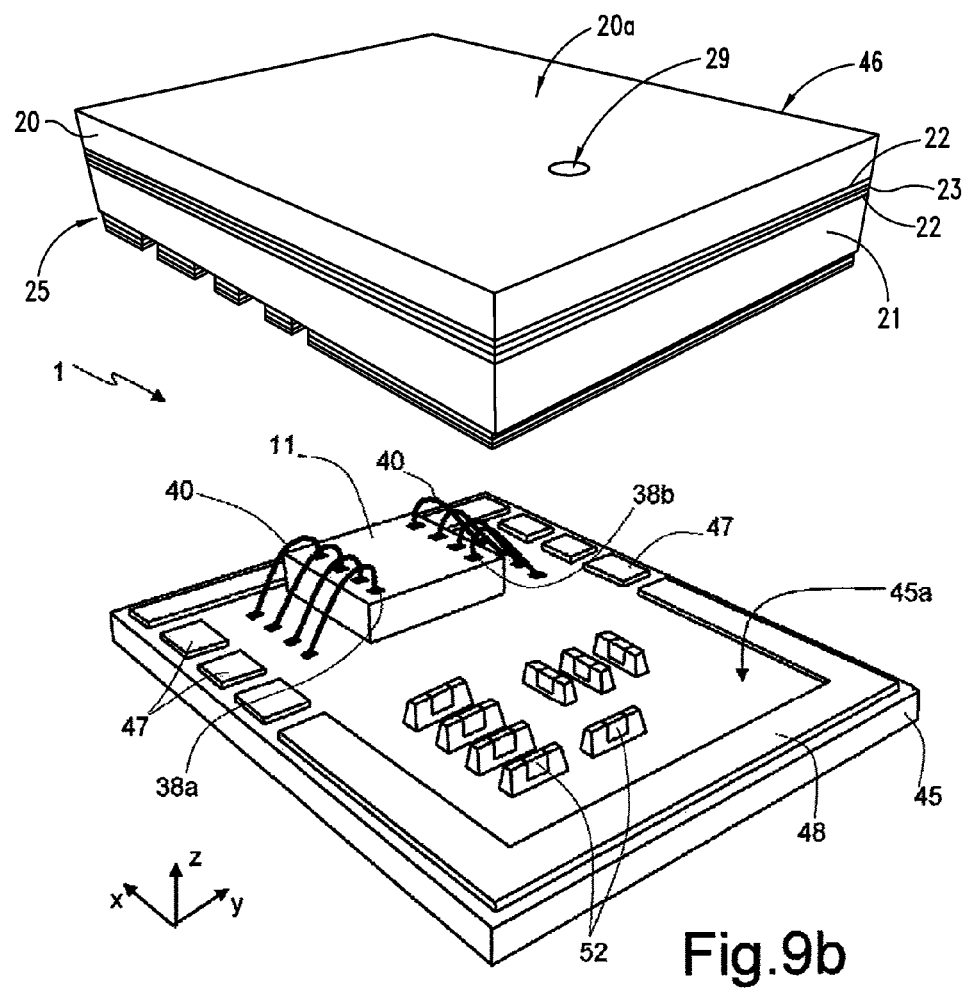

Yet a further different embodiment of the present disclosure (shown in FIG. 8 and in the corresponding FIGS. 9a and 9b) envisages that the second die 11 (integrating the ASIC) is coupled, with traditional techniques, to the first main face 45a of the printed-circuit substrate 45, together with the possible further electrical components 52. In this case, the first electrical wires 39 are connected inside the package 46 between the first contact pads 36 and the cavity-connect lands 30, whilst the second electrical wires 40 connect the second contact pads 38a (which define input pads) with the substrate contact pads 47 (for receiving the electrical quantities generated by the micromechanical sensing structure), and further second electrical wires, which are also designated by 40, connect the third contact pads 38b (which define output pads) to the external contact pads 49 and/or to the further electrical components 52. This solution can possibly enable a saving in the occupation of area in the horizontal plane xy inside the package 46.

Figure 10:
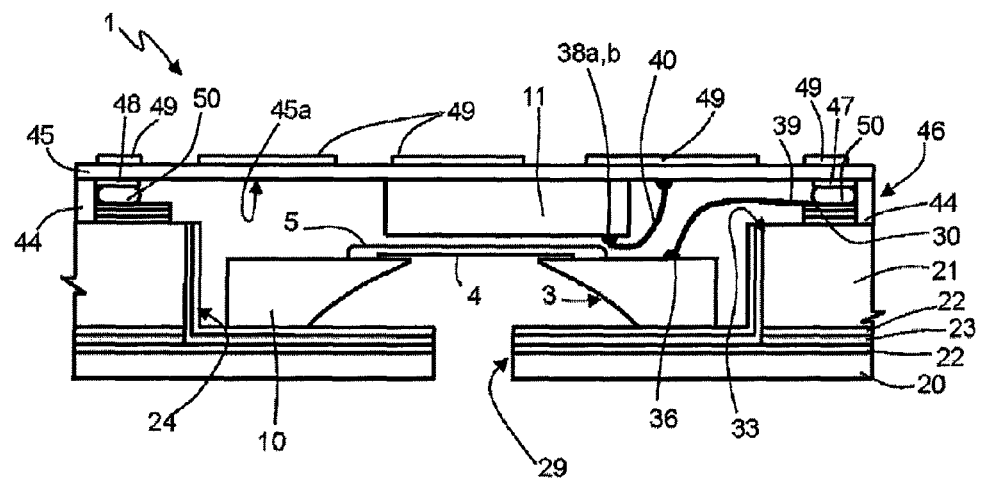
FIGS. 10 and 11 show cross-sectional views of further embodiments of the present disclosure.

As shown in FIG. 10 (which is not drawn to scale), the horizontal dimensions of the package 46 may be further reduced in the case in which the second die 11 (integrating the ASIC) is placed overlying the first die 10 inside the same package. In particular, the second die 11 is attached to the first main face 45a of the printed-circuit substrate 45 in a position vertically corresponding to the first die 10, at least partially overlying the cavity 3 (the printed-circuit substrate 45 being placed with the "flip-chip" technique).

In this case, the vertical dimensions of the package 46 are such as to accommodate both dice 10, 11, while touching of the overlapping first and second electrical wires 39, 40 may be avoided by a suitable offset in the horizontal plane xy of the corresponding contact pads. As previously noted, a "glob top" region may advantageously be formed on the top surface 11b of the second die 11, to protect the electrical wires.

Moreover, the horizontal dimensions of the cavity 24 may be such that lateral sides of the first die 10 are close to the second metal layer 28, which coats the inside of the same cavity 24. In particular, this solution may advantageously allow to achieve horizontal dimensions of the package 46 as small as 2 mm×2 mm. Also, this solution provides very short paths of the electrical wirings between the dice 10, 11, while still providing large volumes of the back and front chambers.

Figure 11:
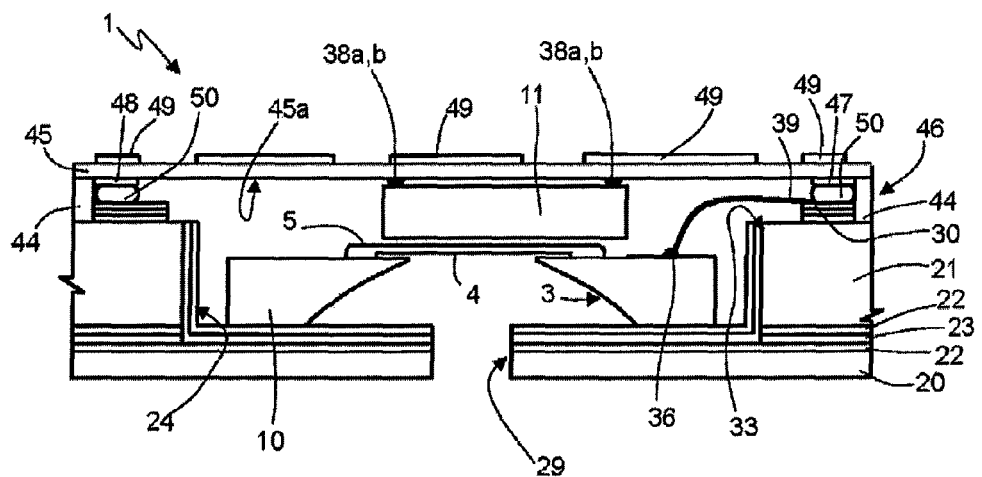

According to a further embodiment, see FIG. 11, the second die 11 may be coupled to the first main face 45a of the printed-circuit substrate 45 with the flip-chip technique, i.e., using suitable contact pads (e.g. in the form of lands or ball), again denoted with 38a or 38b, provided on the active surface of the die for electrical and mechanical contact to the printed-circuit substrate 45.

Advantageously, this solution allows to further reduce the vertical occupation of the space inside the package 46, thanks to the absence of electrical wirings 40 for electrical connection of the second die 11, and is thus particularly suitable to achieve small overall dimensions (e.g., in the case of the 2 mm×2 mm package).

A further aspect of the present disclosure is directed to a further improvement of the EMI shielding for the MEMS acoustic transducer.

Indeed, the presence of electrical wires carrying signals (e.g., the first electrical wires 39 connecting the cavity connect lands 30 to the substrate contact pads 47 through the contact regions 50 in the embodiment just discussed shown in FIGS. 10, 11), which are very close to the package lateral side surfaces (or edges) may cause problems of interferences with external electromagnetic waves; this issue may be particularly felt in the case of acoustic transducers.

Figure 12:
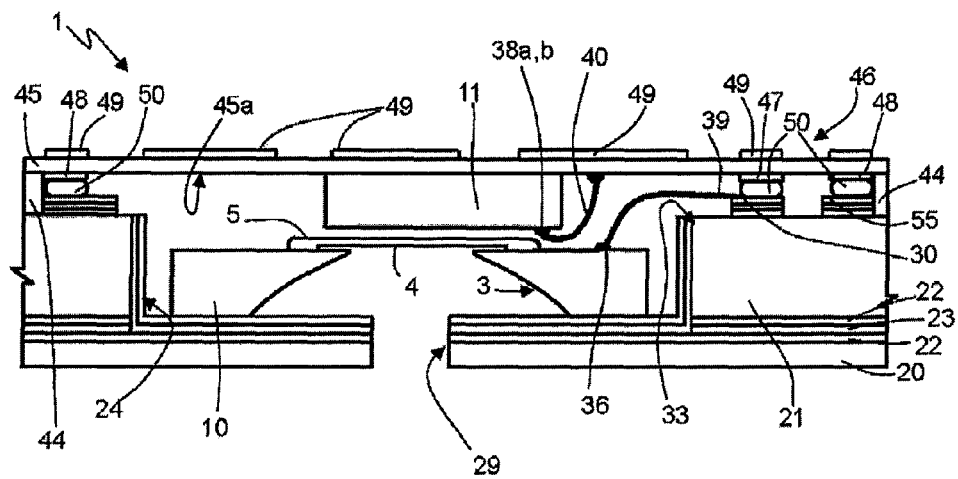
FIG. 12 shows a cross-sectional views of still a further embodiment of the present disclosure.

In order to improve EMI shielding, it is further disclosed, see FIG. 12, to provide a double row of contact pads between the printed-circuit substrate 45 and composite cap 25, one row of which is arranged beside the cavity connect lands 30 on the same first surface 21a of the second cap layer 21, thus being laterally interposed between the same cavity connect lands 30 and the package lateral surface or edge.

The additional contact pads are denoted as shielding pads 55, and are connected via further contact regions 50 to further conductive strips 48 (or analogous contact regions) on the first main face 45a of the printed-circuit substrate 45. Shielding pads 55 are electrically connected to the ground reference potential, so as to define an EMI shield for the MEMS transducer (together with the remaining portions 28' of the second metal layer 28).

The sealing region 44 is in this case provided externally to the further contact regions 50, at the edge of the package 46 of the MEMS acoustic transducer.

The lateral distance between the shielding pads 55 and the cavity connect lands 30 may be properly designed according to the needs and electrical features of the particular MEMS transducer being realized.

Figure 13:
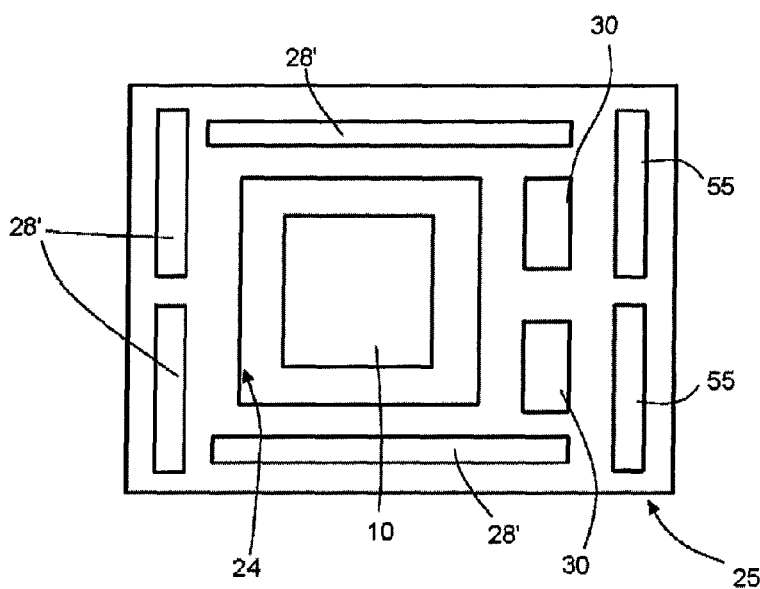
FIG. 13 shows a schematic top view of a composite cap layout in the embodiment of FIG. 12.

FIG. 13 shows schematically a possible layout of the various contacts in the composite cap 25, in an embodiment where, besides two cavity connect lands 30, two aligned shielding pads 55 are provided, which provide, together with the remaining portions 28' of the second metal layer 28 a complete electromagnetic shield for the MEMS transducer, surrounding the cavity 24 at all its sides.

The advantages of the MEMS acoustic transducer and of the corresponding assembly process emerge clearly from the foregoing description.

In particular, it is once again emphasized that the use of a composite cap structure made of plastic material (in particular BT material) enables the use of traditional manufacturing techniques (mass-production techniques), without it being necessary to use specific molding tools and machinery. It is in this way easy to adapt the process to different shapes or sizes of the package, without incurring in high costs for tooling.

The assembly described enables convenient tuning of the volumes of the front and back chambers of the MEMS acoustic transducer 1 and achievement of high electrical performance of the transducer in terms, for example, of the frequency response and of the signal-to-noise ratio (SNR).

Use of the cavity-connect lands 30, as previously emphasized, enables providing of the electrical connections inside (and towards the outside of) the package 46 already during assembly of the composite cap 25, enabling the dual advantage of providing in a simple and inexpensive way, with the same processing steps, both the connections to the printed-circuit substrate 45 and a totally shielded cavity 24 inside the package 46.

In addition, the described process makes it possible to carry out marking of the package 46 in an initial step thereof, thus enabling elimination of the risk of contamination by dust or by external agents of the MEMS acoustic transducer 1 (which in the initial step has not yet been coupled to the structure being assembled).

The layout proposed for the package 46 of the MEMS acoustic transducer 1 moreover minimizes exposure of the electrical/electronic components inside the cavity 24 to light radiation, given that light radiation is largely absorbed by the micromechanical sensing structure integrated in the first die 10, which is set between the acoustic access port 29 and the inside of the cavity 24. For the same reason, the electrical wire connections inside the cavity 24, in particular for connection between the first and second dice 10, 11, are better protected from the outside environment, as compared to traditional package solutions (of the same "top port" type).

Also the mechanical robustness of the assembly is in general improved, given that the micromechanical sensing structure (integrated in the first die 10) is attached to the composite cap 25 in an area corresponding to its internal surface opposite to the printed-circuit substrate 45 (the top delimitation surface 24a of the cavity 24) so that the sturdiness and strength at drop tests are improved.

Moreover, EMI shielding of the MEMS transducer is enhanced in case shielding pads 55 are provided laterally to the cavity connect lands 30.

Figure 14:
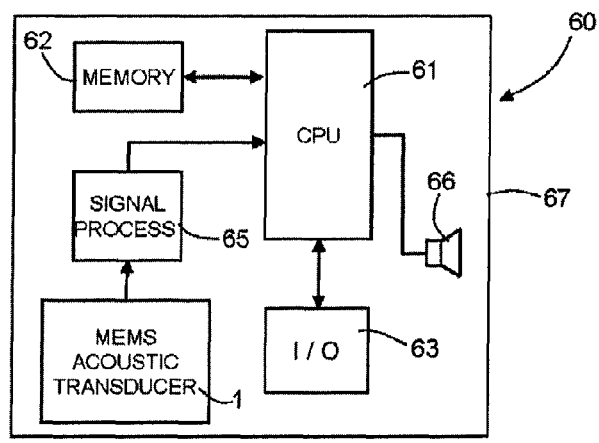
FIG. 14 shows a general block diagram of an electronic device incorporating the MEMS acoustic transducer according to a further aspect of the present invention.

The characteristics previously listed render the use of the MEMS acoustic transducer 1 particularly advantageous in an electronic device 60, as shown in FIG. 14. The electronic device 60 is preferably a mobile communications device, such as, for example, a cell phone, a PDA, a notebook, but also a voice recorder, an audio-file reader with voice-recording capacity, etc. Alternatively, the electronic device 60 may be a hydrophone, capable of working under water, or else a hearing-aid device.

The electronic device 60 comprises a microprocessor (CPU—central processing unit) 61, a memory block 62, connected to the microprocessor 61, and an input/output interface 63, for example provided with a keyboard and a display, which is also connected to the microprocessor 61. The MEMS acoustic transducer 1 communicates with the microprocessor 61. In particular, the ASIC in the second die 11 sends electrical output signals to the microprocessor 61 (a further electronic circuit for processing these electrical output signals, designated by 65, may possibly be present). A loudspeaker 66 is also provided for generation of sounds on an audio output (not shown) of the electronic device 60. As shown schematically, the MEMS acoustic transducer 1, the microprocessor 61, the memory block 62, the input/output interface 63, and the possible further electronic components are coupled to a single printed circuit board 67, for example using the SMD technique.

Finally, it is clear that modifications and variations may be made to what has been described and illustrated herein, without thereby departing from the scope of the present disclosure.

In particular, it is emphasized once again that, generally, the shapes and configurations of the structural elements described can be different from what has been described and illustrated so far, as likewise the electrical components that can be coupled inside the package may be different. For example, further electrical/electronic components could be appropriately coupled to the composite cap 25, which can be electrically reached via the cavity-connect lands 30.

Figure 15:
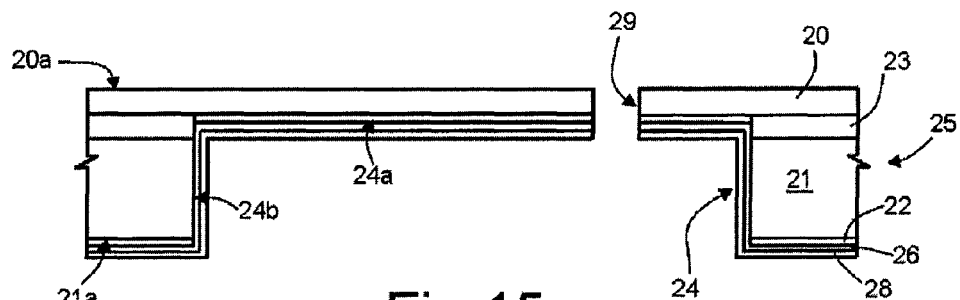
FIG. 15 shows a cross section through a further variant of a MEMS acoustic transducer, corresponding to that of FIG. 3c.

In particular, as shown in FIG. 15, the early steps of the manufacturing process may be modified so as to achieve a direct bonding between the first cap layer 20 and the second cap layer 21, without the interposition of a metal layer.

In this case, boundary portions of the first metal layer 22 are selectively removed from the main faces of the first and second cap layers 20, 21, before attaching the same cap layers via the adhesion layer 23 (and forming the cavity 24, as previously discussed).

This solution is advantageous, in that the adhesion layer 23 (generally an organic material) has a better adherence with the core material of the first and second cap layers 20, 21, as compared to the metal layer; also, singulation of the finished devices, via a cutting operation, leads to a smaller number of defects, thanks to the absence of a intermediate metal layer between the cap layers 20, 21. Moreover, it is clear that the number and arrangement of the shielding pads 55 arranged laterally to the cavity connect lands 30 (so as the arrangement of the remaining portions 28' of the metal layer 28) may vary from what has been shown, while maintaining the discussed EMI shielding function.

In addition, it is evident that the assembly proposed can advantageously be used also for other types of MEMS transducers and corresponding packages, envisaging the presence of an access port enabling fluid communication between the external environment and the inside of the package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS transducer, comprising:
a micromechanical sensing structure;
a package that includes a substrate and a lid, the substrate having a first surface that is opposite to a second surface, the lid is coupled to the first surface of said substrate, the package includes an internal cavity in which said micromechanical sensing structure is housed, said lid including:
a cap layer having a first surface and a second surface opposite to one another, said first surface including an external face of said package and said second surface facing said first surface of the substrate inside said package, the micromechanical sensing structure being coupled to said second surface of said cap layer, inside said package; and
a wall structure positioned between said cap layer and said substrate, the wall structure having a coupling face that faces the first surface of the substrate;
first electrical-connection elements formed on the first surface of the substrate; and
second electrical-connection elements formed on the coupling face of said wall structure, the second electrical-connection elements being coupled to the first electrical-connection elements and being configured to electrically couple said micromechanical sensing structure to said first electrical-connection elements, at least two of the second electrical-connection elements being electrically separated from each other by a groove formed into the wall structure.

2. The transducer according to claim 1, wherein said wall structure delimits and surrounds said internal cavity with corresponding wall surfaces, and said second electrical-connection elements include cavity-connect lands, electrically insulated from one another.

3. The transducer according to claim 2, further comprising:
electrical contact regions that couple said cavity-connect lands to said first electrical-connection elements, electrical contact regions being positioned between said coupling face and said first surface of the substrate; and
a sealing region positioned between said wall structure and said substrate, externally to said electrical contact regions with respect to said cavity.

4. The transducer according to claim 3, wherein said electrical contact regions include a solder paste material.

5. The transducer according to claim 3, wherein said sealing region and said electrical contact regions include a same resin material, which is conductive along a vertical direction and non-conductive in a horizontal plane, transverse to said vertical direction.

6. The transducer according to claim 1, wherein said cap layer includes an access port configured to enable a fluid communication between the inside and an outside of said package, and said micromechanical sensing structure is integrated in a first die coupled to said second surface of said cap layer, in an area corresponding to said access port; said micromechanical sensing structure including a structural layer, a sensing cavity formed in said structural layer, and a membrane, said sensing cavity being in fluid communication with said access port and said membrane separating said sensing cavity from said internal cavity.

7. The transducer according to claim 6, wherein said micromechanical sensing structure is configured to detect acoustic pressure waves; said sensing cavity constitutes a front chamber, and said internal cavity constitutes a back chamber of said MEMS transducer.

8. The transducer according to claim 6, further comprising:
first conductive pads formed on said first die; and
first wire-connection elements configured to electrically couple said second electrical-connection elements and the first conductive pads.

9. The transducer according to claim 6, further comprising:
a second die integrating a processing circuit operatively coupled to said micromechanical sensing structure, said second die being coupled to said second surface of said cap layer, laterally with respect to said first die;
first conductive pads formed on said first die;
second and third conductive pads formed on said second die;
first wire-connection elements electrically coupled between the first conductive pads and the second conductive pads; and
second wire-connection elements electrically coupled between the third conductive pads and said second electrical-connection elements.

10. The transducer according to claim 6, further comprising external connection pads configured to electrically connect to an external printed circuit,
the second surface of the substrate including the external connection pads; and
coupling elements to electrically couple said first electrical-connection elements and said external connection pads.

11. The transducer according to claim 10, further comprising an electrical component coupled to said first surface of said substrate inside said internal cavity; said coupling elements of said substrate being further configured to electrically couple said electrical component and at least one of said first electrical-connection elements and said external connection pads.

12. The transducer according to claim 10, further comprising:
a second die including a processing circuit operatively coupled to said micromechanical sensing structure, said second die being coupled to said first surface of said substrate;
first wire-connection elements electrically coupled between said second electrical-connection elements and first conductive pads formed on said first die; and
second wire-connection elements electrically coupled between said second electrical-connection elements and second conductive pads formed on said second die.

13. The transducer according to claim 10, further comprising:
a second die coupled to said first surface of said substrate in a position at least partially overlying said micromechanical sensing structure; and
a processing circuit integrated in the second die and operatively coupled to said micromechanical sensing structure.

14. The transducer according to claim 1, wherein said cap layer and said wall structure are constituted by distinct layers coupled to one another and made of a same plastic material.

15. The transducer according to claim 1, further comprising shielding contact elements formed on said coupling face of said wall structure, laterally with respect to the second electrical-connection elements so as to be interposed between the second electrical-connection elements and a lateral edge of the package; the shielding contact elements being configured to provide an electromagnetic shield.

16. An electronic device, comprising:
a control unit; and
a MEMS transducer electrically coupled to said control unit, the MEMS transducer including:
a micromechanical sensing structure;
a package that includes a substrate and a lid coupled to said substrate, the package including an internal cavity in which said micromechanical sensing structure is housed, said lid including:
a cap layer having a first surface and a second surface opposite to one another, said first surface being an external face of said package and said second surface facing said substrate inside said package, the micromechanical sensing structure being coupled to said second surface of said cap layer, inside said package; and
a wall structure positioned between said cap layer and said substrate, and having a coupling face that faces the substrate;
first electrical-connection elements formed on the substrate;
second electrical-connection elements formed on the coupling face of said wall structure, the second electrical-connection elements being configured to electrically couple said micromechanical sensing structure to said first electrical-connection elements, the second electrical-connection elements include cavity-connect lands, electrically insulated from one another; and
a conductive sealing region positioned between said wall structure and said substrate, externally to cavity-connect lands with respect to said cavity.

17. The electronic device according to claim 16, wherein said wall structure delimits and surrounds said internal cavity with corresponding wall surfaces.

18. The electronic device according to claim 17, wherein the MEMS transducer includes:
solder-paste regions couple said cavity-connect lands to said first electrical-connection elements, the solder paste regions being positioned between said coupling face and said substrate.

19. The electronic device according to claim 16, wherein said cap layer includes an access port configured to enable a fluid communication between the inside and the outside of said package, and said micromechanical sensing structure is integrated in a first die coupled to said second surface of said cap layer, in an area corresponding to said access port; said micromechanical sensing structure comprising a structural layer, a sensing cavity formed in said structural layer, and a membrane, said sensing cavity being in fluid communication with said access port and said membrane separating said sensing cavity from said internal cavity.

20. The electronic device according to claim 19, wherein the MEMS transducer includes:
   first conductive pads formed on said first die; and
   first wire-connection elements configured to electrically couple said second electrical-connection elements and the first conductive pads.

21. The electronic device according to claim 19, wherein the MEMS transducer includes:
   a second die including a processing circuit operatively coupled to said micromechanical sensing structure, said second die being coupled to said second surface of said cap layer, laterally with respect to said first die;
   first conductive pads formed on said first die;
   second and third conductive pads formed on said second die;
   first wire-connection elements electrically coupled between the first conductive pads and the second conductive pads; and
   second wire-connection elements electrically coupled between the third conductive pads and said second electrical-connection elements.

22. The electronic device according to claim 19, wherein the MEMS transducer includes external connection pads configured for electrical connection to an external printed circuit, wherein said substrate includes:
   a third surface facing said internal cavity and said first electrical-connection elements being formed on the third surface;
   a fourth surface opposite to said third surface and the external connection pads being formed on the fourth surface; and
   coupling elements electrically couple said first electrical-connection elements and said external connection pads.

23. The electronic device according to claim 22, wherein the MEMS transducer includes an electrical component coupled to said third surface of said substrate inside said internal cavity; said coupling elements of said substrate being further configured to electrically couple said electrical component and at least one of said first electrical-connection elements and said external connection pads.

24. The electronic device according to claim 22, electronic device:
   a second die including a processing circuit operatively coupled to said micromechanical sensing structure, said second die being coupled to said third surface of said substrate;
   first wire-connection elements electrically coupled between said second electrical-connection elements and first conductive pads formed on said first die; and
   second wire-connection elements electrically coupled between said second electrical-connection elements and second conductive pads formed on said second die.

25. An assembly process for assembling a MEMS transducer, comprising:
   providing a micromechanical sensing structure;
   forming a package, including:
      providing a substrate, carrying first electrical-connection elements;
      providing a lid including:
         forming a cap layer having a first surface and a second surface, set opposite to one another; and
         forming an internal cavity by forming a wall structure coupled to said cap layer, the wall structure having a coupling face opposite to said cap layer and facing the substrate;
      coupling said lid to said substrate, including coupling said coupling face of said wall structure to said substrate and delimiting said internal cavity, said first surface including an external face of said package and said second surface facing said substrate inside said package;
   housing the micromechanical sensing structure in the internal cavity;
   forming cavity-connect lands on said coupling face of said wall structure prior to coupling said lid to said substrate;
   electrically separating the cavity-connect lands from each other by forming grooves in the wall structure;
   fixing to said second surface of said cap layer the micromechanical sensing structure prior to coupling said lid to said substrate; and
   electrically coupling said cavity-connect lands to said micromechanical sensing structure, wherein
   coupling said lid to said substrate includes electrically coupling said cavity-connect lands to said first electrical-connection elements.

26. The process according to claim 25, wherein forming the cavity-connect lands includes:
   forming a metal coating layer on said coupling face and on wall surfaces of said wall structure delimiting said internal cavity;
   forming said cavity-connect lands from said metal coating layer in a manner that insulates said cavity-connect lands from one another and with respect to portions of said metal layer remaining on said wall surfaces.

27. The process according to claim 25, wherein electrically coupling said cavity-connect lands to said micromechanical sensing structure comprises connecting said cavity-connect lands to first conductive pads of said micromechanical sensing structure by first wire-connection elements.

28. The process according to claim 25, further comprising:
   affixing the first electrical-connection elements to the substrate prior to coupling the lid to the substrate;
   forming said first electrical-connection elements on a first face of said substrate and external connection pads on a second face of said substrate opposite to said first face, in such a way that said external connection pads are electrically coupled to said first electrical-connection elements; and
   forming electrical contact regions on said first electrical-connection elements, wherein said coupling the lid to the substrate includes:
      positioning said substrate with respect to said lid in such a way that said electrical contact regions are located in positions corresponding to said cavity-connect lands; and
      bonding said substrate to said lid, at least in part through said electrical contact regions.

29. The process according to claim 25, wherein:
providing the lid comprises forming through said cap layer an access port configured to enable a fluid communication between the inside and an outside of said package;
providing the micromechanical sensing structure comprises providing said micromechanical sensing structure inside a first die, said micromechanical sensing structure comprising a structural layer, a sensing cavity formed in said structural layer, and a membrane; and
fixing the micromechanical sensing structure to said second surface of said cap layer comprises fixing said first die to said second surface, at said access port, said sensing cavity is in fluid communication with said access port and said membrane separates said sensing cavity from said internal cavity.

30. The process according to claim 29, further comprising, prior to coupling said lid to said substrate:
    providing a processing circuit in a second die;
    fixing said second die to said second surface of said cap layer, laterally with respect to said first die; and
    connecting first wire-connection elements between first conductive pads formed on said first die and second conductive pads formed on said second die, and second wire-connection elements between third conductive pads formed on said second die and said cavity-connect lands.

31. The process according to claim 29, wherein said substrate has a third surface that includes said first electrical-connection elements, and a fourth surface, opposite to said third surface, further comprising:
    forming on the fourth surface external connection pads configured for electrical connection to an external printed circuit board;
    integrating a processing circuit in a second die;
    fixing said second die to said third surface of said substrate;
    connecting first wire-connection elements between first conductive pads formed on said first die and said cavity-connect lands; and
    electrically coupling, by second wire-connection elements, second conductive pads formed on said second die and said cavity-connect lands.

32. A MEMS transducer, comprising:
    a first die that includes a micromechanical sensing structure;
    a package that includes a substrate and a lid coupled to the substrate and forms an internal cavity that houses the first die, the lid including:
        a cap layer having a first surface and a second surface opposite to one another, the first surface forms an external face of the package and the second surface faces the substrate inside the package, the first die being coupled to the second surface of the cap layer, inside the package; and
        a wall structure positioned between the cap layer and the substrate, and having a coupling face coupled to the substrate;
    first electrical-connection elements formed on the substrate;
    second electrical-connection elements formed on the coupling face of the wall structure, the second electrical-connection elements being configured to electrically couple the micromechanical sensing structure to the first electrical-connection elements; and
    a second die including a processing circuit coupled to the micromechanical sensing structure, the second die being coupled to the second surface of the cap layer, laterally with respect to the first die;
    first conductive pads formed on said first die;
    second and third conductive pads formed on said second die;
    first wire-connection elements electrically coupled between the first conductive pads and the second conductive pads; and
    second wire-connection elements electrically coupled between the third conductive pads and said second electrical-connection elements.

33. The transducer of claim 32 wherein ones of the second electrical-connection elements are electrically isolated from one another by grooves formed through the wall structure.

34. The transducer of claim 33, further comprising sealing regions positioned externally with respect to the second electrical-connection elements and positioned between the wall structure and the substrate.

35. A MEMS transducer, comprising:
    a micromechanical sensing structure;
    a package that includes a substrate and a lid coupled to the substrate and forms an internal cavity in which the micromechanical sensing structure is housed, the lid including:
        a cap layer having a first surface and a second surface opposite to one another, the first surface forms an external face of the package and the second surface faces the substrate inside the package, the micromechanical sensing structure being coupled to the second surface of the cap layer, inside the package; and
        a wall structure positioned between the cap layer and the substrate, and having a coupling face coupled to the substrate;
    first electrical-connection elements formed on the substrate;
    second electrical-connection elements formed on the coupling face of the wall structure, the second electrical-connection elements being configured to electrically couple the micromechanical sensing structure to the first electrical-connection elements; and
    shielding contact elements formed on the coupling face of the wall structure, laterally with respect to the second electrical-connection elements, the shielding contact elements being between the second electrical-connection elements and a lateral edge of the package.

36. The transducer of claim 35 wherein ones of the second electrical-connection elements are electrically isolated from one another by grooves formed through the wall structure.

37. The transducer of claim 36 wherein the coupling face of the wall structure faces the substrate.

38. The transducer of claim 35 wherein the shielding contact elements are configured to provide an electromagnetic shield.

39. A MEMS transducer, comprising:
    a micromechanical sensing structure;
    a package that includes a substrate and a lid coupled to said substrate that form an internal cavity in which said micromechanical sensing structure is housed, said lid including:
        a cap layer having a first surface and a second surface opposite to one another, said first surface forms an external face of said package and said second surface faces said substrate inside said package, the micromechanical sensing structure being coupled to said second surface of said cap layer, inside said package; and
        a wall structure positioned between said cap layer and said substrate, and having a coupling face coupled to said substrate;
    first electrical-connection elements formed on the substrate;
    second electrical-connection elements formed on the coupling face of said wall structure, the second electrical-connection elements being configured to electrically couple said micromechanical sensing structure to said first electrical-connection elements, the second electrical-connection elements include cavity-connect lands, electrically insulated from one another;

electrical contact regions that couple said cavity-connect lands to said first electrical-connection elements, electrical contact regions being positioned between said coupling face and said first surface of the substrate; and a sealing region positioned between said wall structure and said substrate, externally to said electrical contact regions with respect to said cavity.

40. The transducer of claim 39 wherein cavity-connect lands are electrically isolated from one another by grooves formed through the wall structure.

41. The transducer of claim 40 wherein the coupling face of the wall structure faces the substrate.

* * * * *